US006556011B1

United States Patent
Yui

(10) Patent No.: US 6,556,011 B1
(45) Date of Patent: Apr. 29, 2003

(54) MAGNETIC RESONANCE IMAGING APPARATUS

(75) Inventor: Masao Yui, Otawara (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/392,638

(22) Filed: Sep. 9, 1999

(30) Foreign Application Priority Data

Sep. 29, 1998 (JP) ............................. 10-275351

(51) Int. Cl.[7] .................................................. G01V 3/00
(52) U.S. Cl. ...................................... 324/318; 324/319
(58) Field of Search ................................. 324/318, 322, 324/309, 306, 307, 319, 320, 300; 600/410, 420, 423; 335/299

(56) References Cited

U.S. PATENT DOCUMENTS

| | | | | |
|---|---|---|---|---|
| 4,689,591 A | * | 8/1987 | McDougall | 335/299 |
| 5,018,178 A | * | 5/1991 | Katsumata | 378/91 |
| 5,278,504 A | * | 1/1994 | Patrick et al. | 324/318 |
| 5,396,207 A | * | 3/1995 | Bizhan et al. | 335/216 |
| 5,416,415 A | * | 5/1995 | Bizhan et al. | 324/318 |
| 5,512,828 A | * | 4/1996 | Pausch et al. | 324/309 |
| 5,646,532 A | | 7/1997 | Knuttel et al. | 324/321 |
| 5,708,360 A | | 1/1998 | Yui et al. | 324/318 |
| 5,793,209 A | * | 8/1998 | Kondo et al. | 324/318 |
| 5,892,359 A | * | 4/1999 | Yui et al. | 324/318 |
| 5,900,793 A | | 5/1999 | Katznelson et al. | 335/296 |
| 5,952,830 A | * | 9/1999 | Petropoulos et al. | 324/318 |
| 6,049,208 A | * | 4/2000 | Takekoshi et al. | 324/319 |
| 6,054,854 A | * | 4/2000 | Kawamoto | 324/318 |
| RE36,881 E | * | 9/2000 | Muller | 324/318 |
| 6,157,278 A | | 12/2000 | Katznelson et al. | 335/296 |

FOREIGN PATENT DOCUMENTS

| | | |
|---|---|---|
| DE | 197 04 696 A1 * | 8/1997 |
| JP | 64-86955 | 3/1989 |
| JP | 7-213506 | 8/1995 |
| JP | 09 215 671 * | 8/1997 |
| JP | 10043158 A | 2/1998 |

* cited by examiner

Primary Examiner—Edward Lefkowitz
Assistant Examiner—Tiffany A. Fetzner
(74) Attorney, Agent, or Firm—Nixon & Vanderhye P.C.

(57) ABSTRACT

An MRI static field magnet coil is symmetrical along the z-axis direction with a static field uniform region center substantially coincident with the center of the coil. However, the gradient field coil has asymmetrical density along the z-axis direction with the gradient field linear region center displaced from the center of the coil. One end of the gradient magnetic field coil in the z-axis direction forms the linear field region and the other end forms u current return portion. In order to make the gradient magnetic field linear region and the static magnetic field uniform region coincident with each other, the center of the gradient magnetic field coil is displaced from the center of the static field magnet. Thus, the gradient magnetic field coil can be extended from one end of the static field magnet until one end is aligned with one end of the static magnetic field uniform region. This permits the bore end of the gantry to be opened accordingly for greater patient comfort and/or medical access.

16 Claims, 3 Drawing Sheets

MAGNETIC RESONANCE IMAGING APPARATUS

BACKGROUND OF THE INVENTION

The present invention relates to a whole-body magnetic resonance imaging apparatus and more specifically to a magnetic resonance imaging apparatus which permits a human subject under examination to have a sensation of openness or easiness when placed within the gantry.

This application is based on Japanese Patent Application No. 10-275351, filed Sep. 29, 1998, the entire content of which is incorporated herein by reference.

In general, in a whole-body magnetic resonance imaging apparatus, a static field magnet and gradient field coil are placed within a gantry (apparatus's cover). The static field magnet consists of either a superconducting magnet, a non-superconducting magnet, or a permanent magnet. The gradient field coil is composed of three coils which are usually referred to as Gx, Gy and Gz coils and produce gradient magnetic fields which linearly vary in intensity in the orthogonal x-, y-, and z-axis directions. Normally, the z-axis direction is coincident with the direction of body axis of a human subject laid down on the couch within the gantry, the x-axis direction is coincident with the direction of width of the human subject, and the y-axis direction is coincident with the direction of thickness of the human subject.

The gradient magnetic fields are used to apply linear gradients to the static magnetic field (main magnetic field) for the purpose of determining arbitrarily an imaging cross-sectional plane and applying position information to RF signals from the human subject. The gradient field coils are required to provide high accuracy in the linearity of gradient fields. The shapes of the gradient field coils vary according to the direction of the static field and the directions of gradients applied to the static field. Usually, the Gz coil is in the form of a pair of loop coils and the Gx and Gy coils are each in the form of a set of four saddle-shaped coils.

The dimensions of the magnetic resonance imaging apparatus is determined by the dimensions of the static field magnet. The gantry for an apparatus of medium and high magnetic fields (0.5 to 1.5 T) is formed in the shape of a cylinder having a depth of about 2 m, an internal diameter of about 60 cm, and an outer diameter of about 2 m. The gantry is of substantially the same size in internal diameter as widths of human bodies (the average width is about 40 cm). The above noted size of the gantry is considered to be a minimum size required to produce a sufficiently uniform static magnetic field and sufficiently linear gradient magnetic fields.

A human subject under examination allowed to have access to the space (imaging area) within the cylindrical gantry has to keep still in the dark, small space during examination and therefore may have a sensation of confinement or suffocation. Although there are differences among individuals, patients who have a severe sensation of confinement cannot undergo the examination in some cases. For this reason, the demand is increasing for apparatus that allows patients to have a greater sensation of openness when placed within the gantry.

To solve this problem, one might first propose to make the lengthwise dimension of apparatus in the direction of the static magnetic field as small as possible. To this end, it is required to shorten the axial length of the static field magnet and the gradient field coils, which will result in a reduction in the size of an area where the uniformity of the static magnetic field and the linearity of the gradient magnetic fields must be ensured and consequently in a degradation in the basic performance of the static field uniformity and gradient field linearity. Even if the axial length can be shortened, the cost would have to be increased to maintain the basic performance.

Referring now to FIG. 1, there is illustrated in side view a schematic of a conventional whole-body magnetic resonance imaging apparatus except gradient amplifiers and a controller. A static field magnet (here, a superconducting magnet) 1, a gradient field coil assembly 2, and an RF coil (reception/transmission coil) 3 are placed in the order mentioned from outside toward inside within a gantry. The coil members in both the static field magnet 1 and the gradient field coil assembly 2 are arranged symmetric along the direction of the static magnetic field (hereinafter referred to as the z direction). For this reason, the center S1 of a region S, indicated by a circle, where the static field is uniform is substantially coincident with the geometrical center 1c of the static field magnet 1. The center G1 of a region G (circular region) where the gradient fields are linear is substantially coincident with the geometrical center 2c of the gradient field coil assembly 2. Of course, the region S where the static field is uniform and the region G where the gradient fields are linear are substantially coincident with each other. These regions S and G are collectively referred to as the imaging region.

Though not shown in FIG. 1, in practice the gradient field coil assembly 2 is composed of three-channel gradient field coils that produce gradient magnetic fields in the three orthogonal directions. The current distribution in the gradient field coil (Gx or Gy coil) that produces a gradient magnetic field along the axis (x or y axis) orthogonal to the z direction is shown in FIG. 2. The Gx or Gy coil consisting of four saddle-shaped coils has two coils arranged in the z-axis direction so that the intermediate portion therebetween forms the gradient field linear region G. For this reason, current return portions 6 are positioned at the axial ends of the gradient field coil assembly 2 and the gradient field coils protrude from the gradient field linear region G in the z-axis direction. Even if use is made of the gradient field coil short in axial length, therefore, patients are subject to limitations in the sensation of openness. The same holds for the case where the static field magnet is shortened.

As described above, the conventional magnetic resonance imaging apparatus has drawbacks that, due to the arrangement of the current return portions of the gradient field coils and the arrangement of coils in the static field magnet, the space where patients are placed is small and the patients' sensation of openness is not enough.

BRIEF SUMMARY OF THE INVENTION

It is an object of the present invention to provide a whole-body magnetic resonance imaging apparatus which permits a patient to have a sensation of openness when laid down in cylindrical space within the gantry by improving the arrangement of the current return portion of the gradient field coil assembly/the coil arrangement in the static field magnet.

According to a first aspect of the present invention, a magnetic resonance imaging apparatus comprises a gantry having an imaging space to which a patient can have access; a static magnetic field generating unit provided in the gantry; and a gradient magnetic field generating unit provided in the gantry, the center of the static magnet field generating unit and the center of the gradient magnetic field generating unit being displaced from each other in the direction of a static magnetic field and the gradient magnetic field generating unit having an asymmetric coil pattern in the direction of the static magnetic field.

In this apparatus, the gradient magnetic field generating unit forms a gradient magnetic field linear region at its one end in the direction of the static magnetic field and a current return portion at its other end. The gradient magnetic field generating unit and the static magnetic field generating unit are placed so that the center of the gradient magnetic field linear region, the center of the static magnetic field uniform region and the center of the static field magnet are substantially coincident with one another.

According to the first aspect of the invention, the imaging region can be positioned to the side of one end of the gradient field coil assembly and the axial length of the gradient field coil assembly can be shortened without degrading the basic performance. In addition, the bore of one end of the gantry can be increased to reduce the patient's sensation of confinement.

A second magnetic resonance imaging apparatus of the present invention is arranged such that, in the first magnetic resonance imaging apparatus, the static magnetic field generating unit comprises a static field magnet having an asymmetric coil pattern in the direction of the static magnetic field and the gradient magnetic field generating unit and the static magnetic field generating unit are placed so that the center of the gradient magnetic field linear region and the center of the static magnetic field uniform region are substantially coincident with each other and the center of the static field magnet and the center of the static magnetic field uniform region are displaced from each other.

According to the second invention, in addition to the advantages of the first invention, the imaging region can be positioned to the side of one end of the static field magnet, further reducing the patient's sensation of confinement.

A third magnetic resonance imaging apparatus of the present invention is arranged such that the first or second apparatus further comprises means for entering physical data of a patient, an imaging region, and an imaging sequence, means for determining the direction in which the patient is inserted into the gantry so that the patient will not undergo magnetic stimulation, or the direction in which the patient is inserted into the gantry so that the patient has a sensation of openness, and means for displaying the direction.

According to the third invention, a patient can be laid down on the couch in a direction to allow him or her to have a sensation of openness with no feeling of magnetic stimulation.

According to a fourth aspect of the present invention, a magnetic resonance imaging apparatus comprises a gantry having a static magnetic field forming unit and an imaging space to which a patient can have access, the gantry having a first bore of a first radius and a second bore of a radius larger than the first radius; and a gradient magnetic field forming unit placed between the inner wall of the gantry of the first bore and the static magnetic field forming unit.

In this apparatus, the center of the first bore is displaced from the center of the gantry in the direction of a static magnetic field. The gradient magnetic field forming unit comprises a coil having a coil pattern such that its magnetic field center is positioned nearer to the second bore side than to its center. The second bore is larger than the internal diameter of the gradient magnetic field forming unit. The static magnetic field forming unit comprises a coil having a coil pattern such that its magnetic field center is coincident with its center.

In the fourth invention as well, the imaging region can be positioned to the side of one end of the gradient field coil assembly and the axial length of the gradient field coil assembly can be shortened without impairing the basic performance. In addition, the bore of one end of the gantry can be increased to reduce the patient's sensation of confinement.

In a fifth magnetic resonance imaging apparatus, the static magnetic field forming unit comprises a coil having a coil pattern such that its magnetic field center is displaced from its center.

According to the fifth invention, in addition to the advantages of the fourth invention, the imaging region can be positioned to the side of one end of the static field magnet, further reducing the patient's sensation of confinement.

A sixth magnetic resonance imaging apparatus of the present invention is arranged such that the fourth apparatus further comprises means for entering physical data of a patient, an imaging region, and an imaging sequence, means for determining the direction in which the patient is inserted into the gantry so that the patient will not undergo magnetic stimulation or the direction in which the patient is inserted into the gantry so that the patient has a sensation of openness, and means for displaying the direction.

According to the fifth invention, a patient can be laid down on the couch in a direction to allow him or her to have a sensation of openness with no feeling of magnetic stimulation.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

A preferred embodiment of a magnetic resonance imaging apparatus according to the present invention will now be described with reference to the accompanying drawings.

First Embodiment

Figure 3:
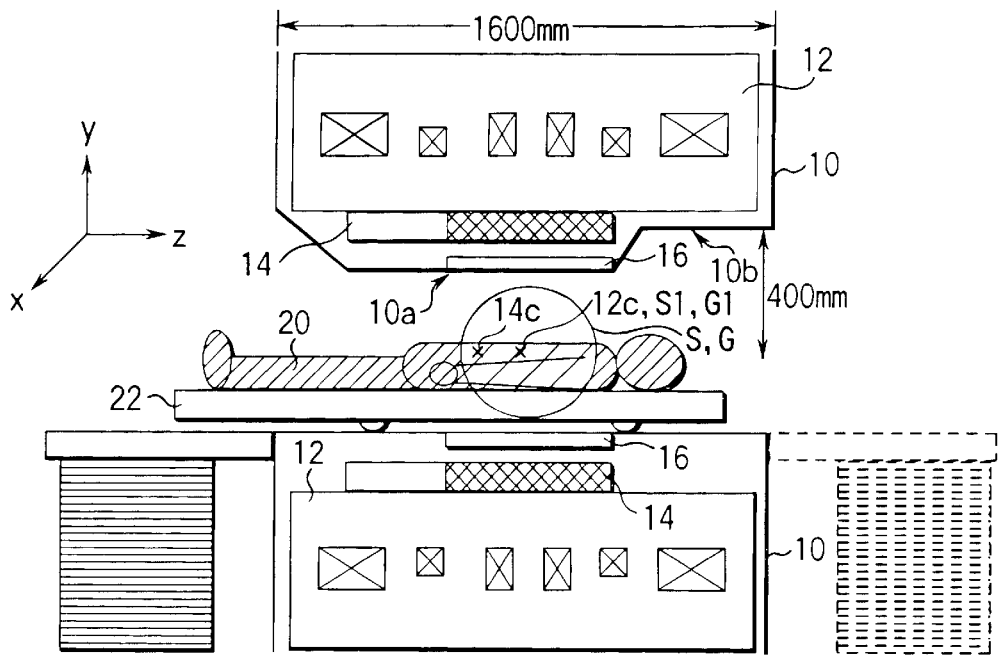
FIG. 3 is a schematic representation of a whole-body magnetic resonance imaging apparatus according to a first embodiment of the present invention.

Referring now to FIG. 3, there is illustrated in side view a schematic of a whole-body magnetic resonance apparatus according to a first embodiment of the present invention except gradient field amplifiers and a controller. A static field magnet (a superconducting magnet is used herein) 12, a gradient field coil assembly 14 and an RF coil (receiver/transmitter coil) 16 are arranged in the order mentioned from outside to inside within a gantry 10. In the static field magnet 12, the coil arrangement is symmetrical along the z axis of the xyz coordinate system, so that, as in the conventional apparatus shown in FIG. 1, the center S1 of a static field uniform region S where the static magnetic field is uniform is substantially coincident with the geometric center 12c of the static field magnet 12.

A patient 20 is placed on a top plate of a bed 22.

Figure 1:
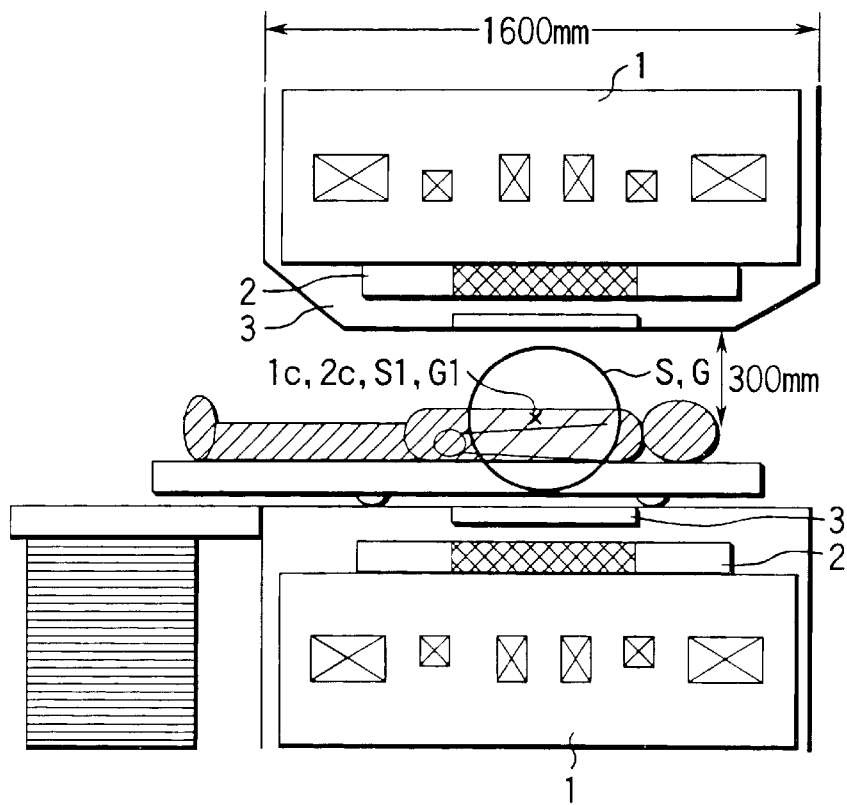
FIG. 1 is a schematic representation of a conventional whole-body magnetic resonance imaging apparatus.
Figure 4:
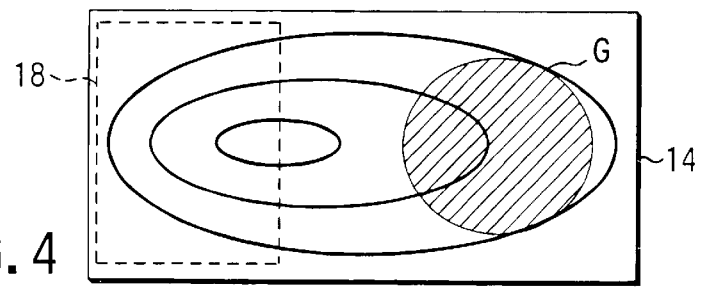
FIG. 4 shows current distribution in the gradient field coil assembly in the first embodiment.

Unlike the conventional apparatus shown in FIG. 1, the coil arrangement in the gradient field coil assembly 14 is asymmetrical along the z axis (i.e., the density of the gradient field coils is non-uniform along the z axis) as shown in FIG. 4, so that the center G1 of the gradient field linear region G where the gradient fields are linear is displaced from the geometric center 14c of the gradient field coil assembly 14.

Figure 2:
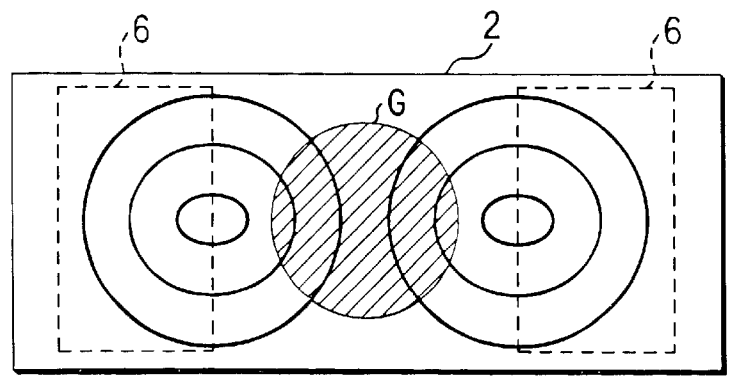
FIG. 2 shows current distribution in the conventional gradient field coil assembly.

FIG. 4 shows current distribution in the gradient field coil assembly 14. Although, in the conventional apparatus of FIG. 2, the gradient field coil assembly is arranged so that the intermediate portion of two coils forms the gradient field linear region G, in the inventive apparatus the gradient field coil assembly is arranged so that the gradient field linear region G is formed on the side of one end of a single coil in the z-axis direction. Thus, the center G1 of the gradient field linear region G of the gradient field coil assembly 14 is displaced significantly from the geometric center 14c of the gradient field coil assembly 14. In practice, the gradient field coil for each channel is formed of a pair of coils above and below the z axis. A current return section 18 is placed at the other end of the gradient field coil assembly 14 in the z-axis direction (i.e., the current return section 18 and the gradient field linear region G are placed on opposite sides of the gradient field coil assembly). That is, the gradient field linear region G and the current return section 18 are placed on the right and left sides of the geometric center 14c of the gradient field coil assembly 14.

In such a gradient field coil assembly 14, in order to make the gradient field linear region G substantially coincident with the static field uniform region S (in order to make the center G1 of the gradient field linear region G substantially coincident with the center S1 of the static field uniform region S), it is required to displace the geometric center 14c of the gradient field coil assembly 14 and the geometric center 12c of the static field magnet 12 from each other rather than making them coincident. By so doing, one end of the gradient field coil assembly 14 (one end of the uniform region G) can be withdrawn to one end of the static field uniform region S and the aperture of the gantry can be widened accordingly. In the conventional apparatus, as shown in FIG. 1, since the gradient field coil assembly 2 has the return sections 6 at opposite ends, the bore of the gantry is uniform (about 300 mm) over the overall axial length. In contrast, in the present embodiment, since there is no return section at one end of the gradient field coil assembly 14 (only the linear region G is present), the bore can be increased in comparison with the conventional apparatus. According to the present embodiment, therefore, the gantry is allowed to have a small bore portion 10a as in the case of the conventional apparatus and a large bore portion 10b (about 400 mm in radius) which is allowed to increase in radius by the absence of the return section. If a patient is placed on the couch with his or her head positioned in the large bore portion, then he or she will be able to have a greater sensation of openness than with the conventional apparatus. In addition, the sensation of openness is obtained with the linearity of the gradient magnetic fields and the uniformity of the static magnetic field maintained because the center G1 of the gradient field linear region G is substantially coincident with the center S1 of the static field uniform region S.

Other embodiments of the magnetic resonance imaging apparatus according to the present invention will be described. The same portions as those of the first embodiment will be indicated in the same reference numerals and their detailed description will be omitted.

Second Embodiment

Figure 5:
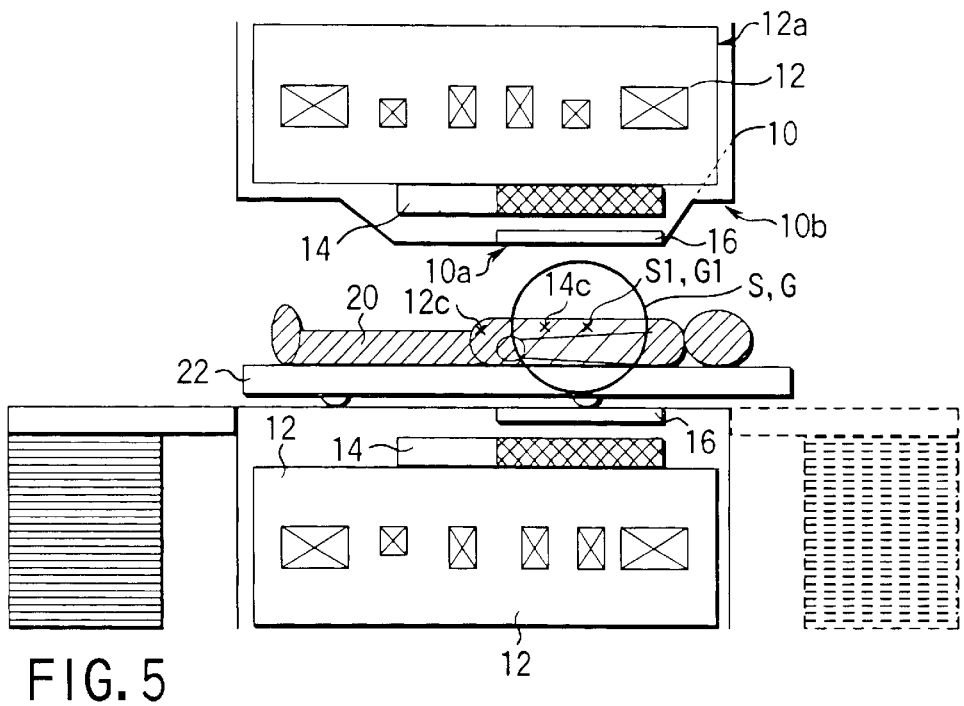
FIG. 5 is a schematic representation of a whole-body magnetic resonance imaging apparatus according to a second embodiment of the present invention.

FIG. 5 is a schematic side view of a magnetic resonance imaging apparatus of the second embodiment. Although, in the first embodiment, only the coil arrangement in the gradient field coil assembly 14 is made asymmetric along the z-axis direction (the coil arrangement in the static field magnet 12 is symmetric along the z-axis direction), in the second embodiment the coil arrangement in the static field magnet is also made asymmetric along the z-axis direction. Thus, in the first embodiment the imaging region is positioned at the geometric center of the static field magnet 12, while, in the second embodiment, the imaging region is shifted in the z-axis direction to the end of the static field magnet 12. That is, the geometric center 14c of the gradient field coil assembly 14 is displaced from the center G1 of the gradient field linear region G and the geometric center 12c of the static field magnet 12 is also displaced from the center S1 of the static field uniform region S. The geometric center 14c of the gradient field coil assembly 14 is displaced from the geometric center 12c of the static field magnet 12. The gradient field linear region G and the static field uniform region S are substantially coincident with each other, and the center G1 of the gradient field linear region G and the center S1 of the static field uniform region S are substantially coincident with each other.

With such a configuration, the static field uniform region S (and the gradient field linear region G) is allowed to approach one end 12a of the static field magnet 12 at which the coil arrangement is dense. As a result, the same body region as with the first embodiment can be imaged without bringing a patient deep into the gantry, allowing the patient's sensation of confinement to be reduced significantly.

In the configuration of FIG. 5, like the configuration of FIG. 3, the gantry 10 has a small bore portion 10a and a large bore portion 10b formed in a stair step like fashion. However, there is no need of providing the large bore portion 10b in particular. Instead, the bore may be increased continuously from one end of the small bore portion 10a as indicated by a broken line in FIG. 5.

Third Embodiment

A third embodiment of the present invention will be described next.

The apparatus of the first and second embodiments described thus far is structured so that only one end of the gantry is made larger than with the conventional apparatus to increase the patient's sensation of openness and the other end of the gantry remains unchanged. In order to relieve the patients' sensation of confinement, therefore, it is required to consider in which direction the patient is to be laid down on the couch, i.e., which of his or her head and feet is to be directed to the interior of the apparatus. With the apparatus of the first and second embodiments, the direction in which the patient is placed on the couch is determined with the intuition of a doctor or technical person. The third embodiment provides a system which can increase the patient's sensation of openness and can inform a doctor or technical person of such a patient placing direction as circumvents a risk of patient's undergoing magnetic stimulation.

Figure 6:
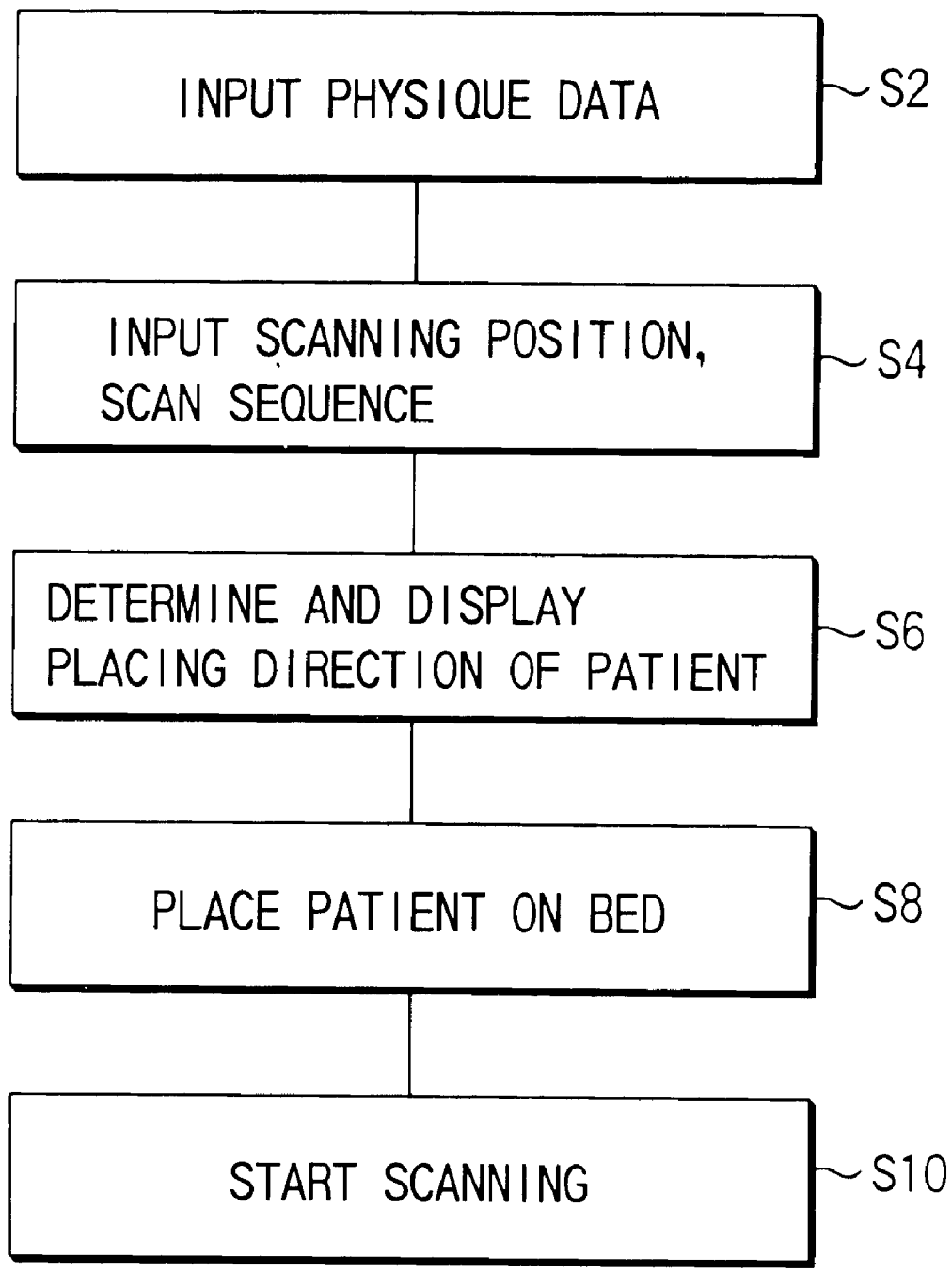
FIG. 6 is a flowchart illustrating the operation of the magnetic resonance imaging apparatus according to a third embodiment of the present invention.

The system of the third embodiment is implemented by a host computer in a sequencer. FIG. 6 is a flowchart illustrating a procedure of the third embodiment. In step S2, data on the physique of a patient, such as his or her height and weight, are entered. In step S4, an imaging body region and an imaging sequence are entered. In step S6, on the basis of the data thus entered, the direction in which the patient is to be laid down on the couch is determined. The direction is determined so that the patient's sensation of openness can be increased and unnecessary magnetic stimulation can be circumvented.

For example, for examination of the patient's liver, it is shown that the patient's sensation of openness is increased by placing the patient's feet on the current return portion side of the gradient field coil assembly rather than placing the patient's head on the current return portion side of the gradient field coil assembly as shown in FIGS. 3 and 5. It is also known that the dB/dt value is large in the vicinity of the geometric center of the gradient field coil assembly. Thus, imaging with the patient placed as shown in FIGS. 3 and 5 will produce a large dB/dt value in the trunk of the patient. The patient may therefore feel magnetic stimulation in fast imaging such as EPI. It is therefore desirable to reverse the placing direction of the patient. Thus, the placing direction in which the patient can have a sensation of openness and feels no magnetic stimulation is determined and then presented to the doctor or the technical person through visual display.

Depending on circumstances, it is impossible to satisfy the two requirements at the same time. In that case, the placing direction is determined so as to satisfy either of the two requirements in accordance with the priority previously specified by the user.

In step S8, the patient is placed in the direction displayed and then, in step S10, imaging is started.

According to such a configuration, the placement direction of the patient on the couch can be set which allows the patient's sensation of confinement to be reduced with no magnetic stimulation. The procedure, while being able to be executed by other than the sequencer host computer, is preferably contained in the host computer from a viewpoint of cost because the amount of processing involved is not so large.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, the gradient field coil assemblies of the respective embodiments may be used in combination.

According to the present invention, as described above, the coil arrangement in the gradient field coil assembly is made asymmetric in the direction of a static magnetic field and the geometric center of the gradient field coil assembly is significantly displayed from the gradient field linear region (the static field uniform region). Therefore, the imaging region can be positioned to the side of one end of the gradient field coil assembly, the axial length of the gradient field coil assembly can be reduced without increasing cost and degrading the basic performance, the radius of the aperture of the gantry at the one end of the gradient field coil assembly can be increased, and the patient's sensation of confinement can be reduced. In addition, if the coil arrangement in the static field magnet is also made asymmetric in the direction of the static magnetic field and the geometric center of the static field magnet is displaced from the gradient field linear region (the static field uniform region), the imaging region can be positioned to the side of one end of the static field magnet and the patient's sensation of confinement can be reduced further.

What is claimed is:

1. A magnetic resonance imaging apparatus comprising:
    a gantry housing having, in cross-section, an upper portion located above a patient space and a lower portion located below the patient space and a static magnet field forming unit that provides an imaging space volume having a substantially uniform magnetic field directed along a predetermined axis to which a body of a patient can enter,
    the gantry having sequentially along said axis a first inner bore of a first radius and a second bore of a second outer radius larger than the first radius, the centers of the first and second bores both being displaced from the center of the gantry along said axis thus making said upper portion of the gantry asymmetrical in cross section with respect to the center of the gantry, and lower portions of the first and second bores under the body of the patient having the same height substantially throughout the length of said first and second bores under the patient space; and
    an asymmetric gradient magnetic field forming unit placed between an inner wall of the gantry housing of the first bore and the static magnetic field forming unit to provide a volume of substantially linear gradient fields asymmetrically positioned away from the center of said first bore and towards said second bore thereby facilitating the larger second outer radius bore positioned to make the upper portion of the gantry asymmetrical in cross section with respect to the center of the gantry.

2. The apparatus according to claim 1, wherein the static field forming unit is also asymmetric such that its magnetic field center is positioned nearer to the second bore side than to its center.

3. The apparatus according to claim 2, wherein the static magnetic field forming unit comprises a coil having a coil pattern such that its magnetic field center is coincident with its center.

4. The apparatus according to claim 2, wherein the static magnetic field forming unit comprises a coil having a coil pattern such that its magnetic field center is displaced from its center.

5. The apparatus according to claim 4, wherein the static magnetic field forming unit comprises a coil having a coil pattern such that its magnetic field center is positioned nearer to the second bore side than to its center.

6. The apparatus according to claim 1, wherein upper portions of the first and second bores over the body of the patient have first and second heights, the second height being larger than the first height.

7. The apparatus according to claim 6, wherein the second bore is larger than an internal diameter of the gradient magnetic field forming unit.

8. The apparatus according to claim 6, wherein the second bore is formed so that its radius changes gradually.

9. The apparatus according to claim 6, further comprising means for entering physical data of the patient, means for defining an imaging region, means for effecting a designated imaging sequence, means for determining a direction in which the patient is inserted into the gantry based on the physical data, the imaging region, and the designated imaging sequence, and means for displaying the determined direction.

10. The apparatus according to claim 9, wherein said determining means determines the direction so that the patient will not undergo magnetic stimulation, and the direction wherein the patient is inserted into the gantry so that the patient has a sensation of openness.

11. A magnetic resonance imaging apparatus comprising:

a gantry housing having, in cross-section, an upper portion located above a patient space and a lower portion located below the patient space and an imaging space volume having a substantially uniform magnetic field directed along a predetermined axis to which a body of a patient can enter, a static magnetic field generating unit provided in the gantry;

the gantry having sequentially along said axis a first inner bore of a first radius and a second outer bore of a radius larger than the first radius, the centers of the first and second bores both being displaced from the center of the gantry along said axis thus making said upper portion of the gantry asymmetrical in cross-section with respect to the center of the gantry, and lower portions of the first and second bores under the body of the patient having the same height substantially throughout the length of said first and second bores under the patient space;

an asymmetric gradient magnetic field generating unit provided in the gantry housing within said first bore to provide a volume of substantially linear gradient field asymmetrically positioned away from the center of said first bore and towards said second bore thereby facilitating the larger second outer radius bore positioned to make the upper portion of the gantry asymmetrical in cross-section with respect to the center of the gantry;

means for entering physical data of a patient, an imaging region, and an imaging sequence; and means for determining a direction in which the patient is inserted into the gantry based on the physical data the imaging region, and the image sequence entered by said entering means.

12. The apparatus according to claim 11, wherein upper portions of the first and second bores over the body of the patient have first and second heights, the second height being larger than the first height.

13. The apparatus according to claim 12, further comprising means for displaying the determined direction.

14. The apparatus according to claim 12, wherein said determining means determines the direction so that the patient will not undergo magnetic stimulation, and the direction wherein the patient is inserted into gantry so that the patient has a sensation of openness.

15. The apparatus according to claim 12, wherein a center of the gradient magnet field generating unit and a center of the static magnetic field generating unit are displaced from each other in a direction of a static magnetic field and the gradient magnetic field generating unit has an asymmetric coil pattern in the direction of the static magnetic field.

16. The apparatus according to claim 12, wherein said asymmetric gradient magnetic field forming unit is placed between an inner wall of the gantry of the first bore and the static magnetic field forming unit.

* * * * *